US008125212B1

(12) United States Patent
White

(10) Patent No.: US 8,125,212 B1
(45) Date of Patent: Feb. 28, 2012

(54) ROTATING COHERENT ELECTROMAGNETIC EMISSION INSTRUMENTATION APPARATUS

(76) Inventor: Lester D. White, Ashburn, VA (US)

( * ) Notice: Subject to any disclaimer, the term of this patent is extended or adjusted under 35 U.S.C. 154(b) by 6 days.

(21) Appl. No.: 12/940,692

(22) Filed: Nov. 5, 2010

(51) Int. Cl.
*G01R 19/00* (2006.01)
*H01S 3/09* (2006.01)

(52) U.S. Cl. .................................... 324/76.11; 505/180

(58) Field of Classification Search ............... 324/76.11, 324/750.12, 754.22; 335/210; 505/180, 505/160, 320, 325
See application file for complete search history.

(56) References Cited

U.S. PATENT DOCUMENTS

| | | | | |
|---|---|---|---|---|
| 4,461,947 | A | 7/1984 | Ward | |
| 5,544,843 | A * | 8/1996 | Johnson | 244/3.11 |
| 5,552,880 | A | 9/1996 | Shapanus et al. | |
| 6,960,975 | B1 | 11/2005 | Volfson | |
| 7,465,886 | B1 | 12/2008 | Kessler | |
| 2008/0020935 | A1 | 1/2008 | Volfson | |
| 2009/0274256 | A1 * | 11/2009 | Lipinski et al. | 376/151 |
| 2010/0001162 | A1 | 1/2010 | Sato et al. | |

* cited by examiner

*Primary Examiner* — Hoai-An D Nguyen
(74) *Attorney, Agent, or Firm* — Richard C. Litman

(57) ABSTRACT

The rotating coherent electromagnetic emission instrumentation apparatus provides instrumentation for cataloguing environmental anomalies that may occur along the circumferential path of a rotating electromagnetic (EM) wave beam having sufficient RPM that the instantaneous change in radial direction of the beam approaches light speed. Under those conditions, it is hypothesized that environmental anomalies, such as energy spikes, which ultimately can be harnessed as an energy source, may occur along or proximate to the circumferential beam path. Sensors are disposed along the circumferential path of the rotating beam. Sensor data providing energy readings are recorded in real time. The sensor data is analyzed in real time, and also post-processed. Since the wavefront energy is known along the circumference, any energy spikes recorded may be attributed to mass-like submeasurable elements of space that may have come in contact with the mass-like components of the high speed rotating electromagnetic wave.

19 Claims, 6 Drawing Sheets

W = Focused Electromagnetic (EM) Wave

A = Point on the Path of a Rotating EM Wave

V = Rotational Velocity

R = Radius of Rotation

G = Electromagnetic Wave Generator

M = Rotation Driver

WP = White Particle (One of Many)

500

| Radius of Rotation in Miles | RPM | RPM Current Examples |
|---|---|---|
| 35.58 | 50,000 | Commercial Pumps |
| 17.79 | 100,000 | Commercial Compressors |
| 5.93 | 300,000 | Automobile Super Chargers |
| 3.56 | 500,000 | Dentist Drills |
| 1.78 | 1,000,000 | Under Development for Research into Micro-Generators |

*Fig. 5*

ROTATING COHERENT ELECTROMAGNETIC EMISSION INSTRUMENTATION APPARATUS

BACKGROUND OF THE INVENTION

1. Field of the Invention

The present invention relates to instrumentation devices, and particularly to a rotating coherent electromagnetic emission instrumentation apparatus for observation of the surrounding environment during high-speed rotation of the laser beam.

2. Description of the Related Art

Over the last 350 years, a host of mathematicians and theoretical physicists have endeavored to define the nature of space, time and matter.

While researching this past work, the inventor noted that the basis of generally accepted concepts regarding space, time, and matter have changed dramatically as one thought process gave way to the next. Sir Isaac Newton's view of absolute space transitioned to Einstein's relativistic space, which, in part, had to be expanded to include Bohr's Quantum Mechanics. Throughout this 350-year period, true giants in the various fields of physics formed diametrically opposed opinions about the nature of the Universe and the inter-relations between energy, mass, and "other" components that make it up. This has led to intellectual challenges, debates, and in some cases, open hostilities that occasionally divided the physics community into competing, if not warring, camps. Such contention in the past has resulted in both wholesale changes and significant refinements to accepted theories, but those conflicts have also consumed large amounts of intellectual resources and spanned decades of time.

With the advent of Quantum Mechanics, the above conflict openly spilled over into the areas of wave particle duality, probabilistics and causality. In 1934 Fritz Zwicky first coined the expression and postulated the existence of "Dark Matter", which in turn, led to the concepts of "Dark Energy, "Dark Fluid" and a host of discoveries that extend from them by Zwicky and others. Since, the theories and related calculations regarding these "substances" are important elements in cosmology and since some differences in opinion continue to exist within the recognized community of leading theoretical physicist, the reader is encouraged to consult material available on the Internet for reference. Such references, in the inventor's opinion, effectively illustrate the key elements and continuing debates that are an integral part of the processes that define physics at this time.

Present cosmological understanding relies on a significant amount of non-baryonic, cold "dark" matter to explain the large-scale structure of the universe. Moreover, the presence of observed gravitational anomalies as well as cosmic microwave background (CMB) radiation suggests that the aforementioned dark matter exists.

Computer simulations of dark matter particles along with galactic surveys that document Doppler shift observations led to the conclusion that the cold dark matter model of structure formation is consistent with these observations.

Based on these studies, the Lambda-CDM model was constructed and measures the cosmological parameters, including the fraction of the universe made up of baryons and dark matter. The Lambda-CDM model predicts that there exists a dark matter component of approximately 25%, a dark energy component of approximately 70%, and a visible, observable universe comprised of approximately 5% of the totality of the cosmos.

Moreover, the Late-time Integrated Sachs-Wolfe Effect is an effect in which it has been observed that accelerated cosmic expansion causes gravitational potential wells and hills to flatten as photons pass through them, producing cold spots and hot spots on the CMB aligned with vast supervoids and superclusters, thus signaling dark energy in a flat universe.

The fabric of space and time as conceptualized by Albert Einstein is the idea that space itself is a stretchable and compressible substance in the presence of matter and that gravitational force is merely the visible consequence of space-time fabric expansion and compression near matter, thus altering the path of objects traveling near other objects.

Dark fluid is another model for gravity, and hypothesizes that the fabric of space acts much like a fluid. Thus space would flow, coagulate, compress, or expand just like any other fluid. The effect of dark fluid is always present but only becomes noticeable in the presence of a really large mass, like a galaxy. Moreover, dark matter is a special case of the equations of Dark Fluid. However, as understood by practitioners having ordinary skill in the art of cosmology, it is recognized that dark fluid theory states actual particles of dark matter do not exist. Rather, dark matter is just an illusionary effect of space bunching up on itself.

On the other extreme, in places where there is relatively little matter, as in the voids between galactic superclusters, dark fluid predicts that space relaxes and starts stretching away from itself. Thus, dark fluid becomes a repulsive force, which is the same effect as dark energy.

Dark fluid goes beyond dark matter and dark energy because it predicts a continuous range of attractive and repulsive qualities under various matter density cases. Dark fluid has been useful in predicting other gravitational theories, such as inflation, quintessence, k-essence, f(R), Generalized Einstein-Aether f(K), MOND, TeVeS, BSTV, and the like, as special cases within it. While the attributes of dark matter particles are not fully understood, it is reasonable to concede that their gravitational related mass-like characteristics can exhibit velocity.

Thus, a rotating coherent electromagnetic emission instrumentation apparatus solving the aforementioned problems is desired.

SUMMARY OF THE INVENTION

The rotating coherent electromagnetic emission instrumentation apparatus provides instrumentation for cataloguing environmental anomalies, which may occur along the circumferential path of a rotating electromagnetic (EM) wave beam having sufficient revolutions per minute (RPM) that the instantaneous change in radial direction of the beam approaches 300,000,000 meters/second. Under those conditions, it is hypothesized that environmental anomalies, such as agglomerated particles with associated energy spikes, may occur along the circumferential beam path.

Sensors are disposed along the circumferential path of the rotating beam. Sensor data providing energy readings are recorded in real time. The sensor data is analyzed in real time, and also post-processed. Since the wavefront energy is known along the circumference, any energy spikes recorded proximate the wavefront may be attributed to mass-like sub-measurable elements of space that may have come in contact with the mass-like components of the high speed rotating electromagnetic wave. A facility may be provided to enclose the rotating apparatus and sensors.

It should be understood that the inventive rotating coherent electromagnetic emission instrumentation apparatus does not represent any attempt to interject or express an opinion on scientific debates regarding dark matter, dark energy, dark fluids or any aspects thereof, but is offered to test some of the theories behind these debates. Rather, the inventive rotating coherent electromagnetic emission instrumentation apparatus represents a practical device that explores and exploits the information, findings and majority opinions found in cosmological literature.

These and other features of the present invention will become readily apparent upon further review of the following specification and drawings.

BRIEF DESCRIPTION OF THE DRAWINGS

FIG. 5 shows a Table of Radius of Rotation vs. required RPM (to achieve light speed) with examples of existing rotational drivers capable of providing such RPM.

Similar reference characters denote corresponding features consistently throughout the attached drawings.

DETAILED DESCRIPTION OF THE PREFERRED EMBODIMENT

Figure 1:
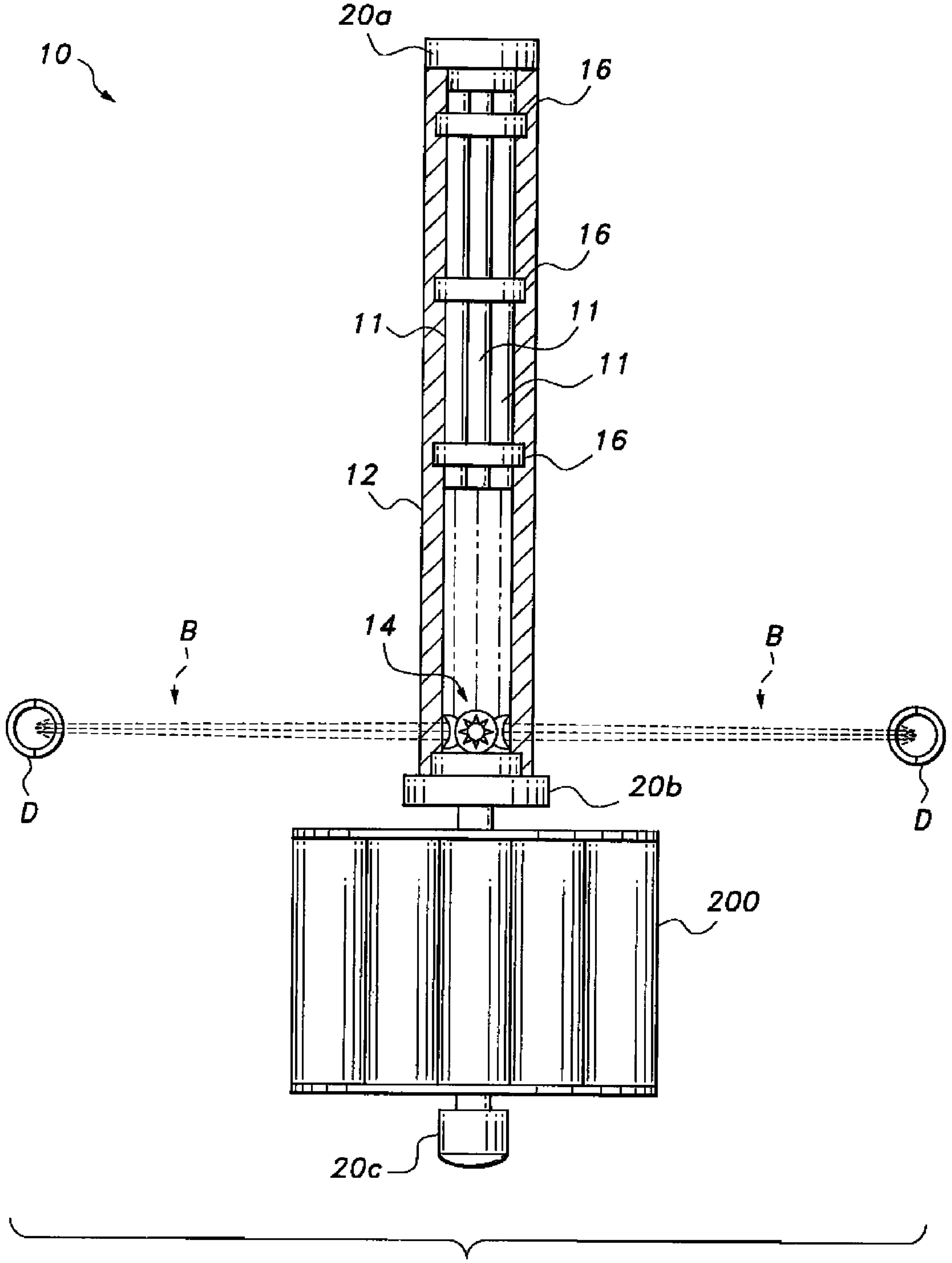
FIG. 1 is a front view of a rotating coherent electromagnetic emission instrumentation apparatus according to the present invention, broken away and partially in section.
Figure 2:
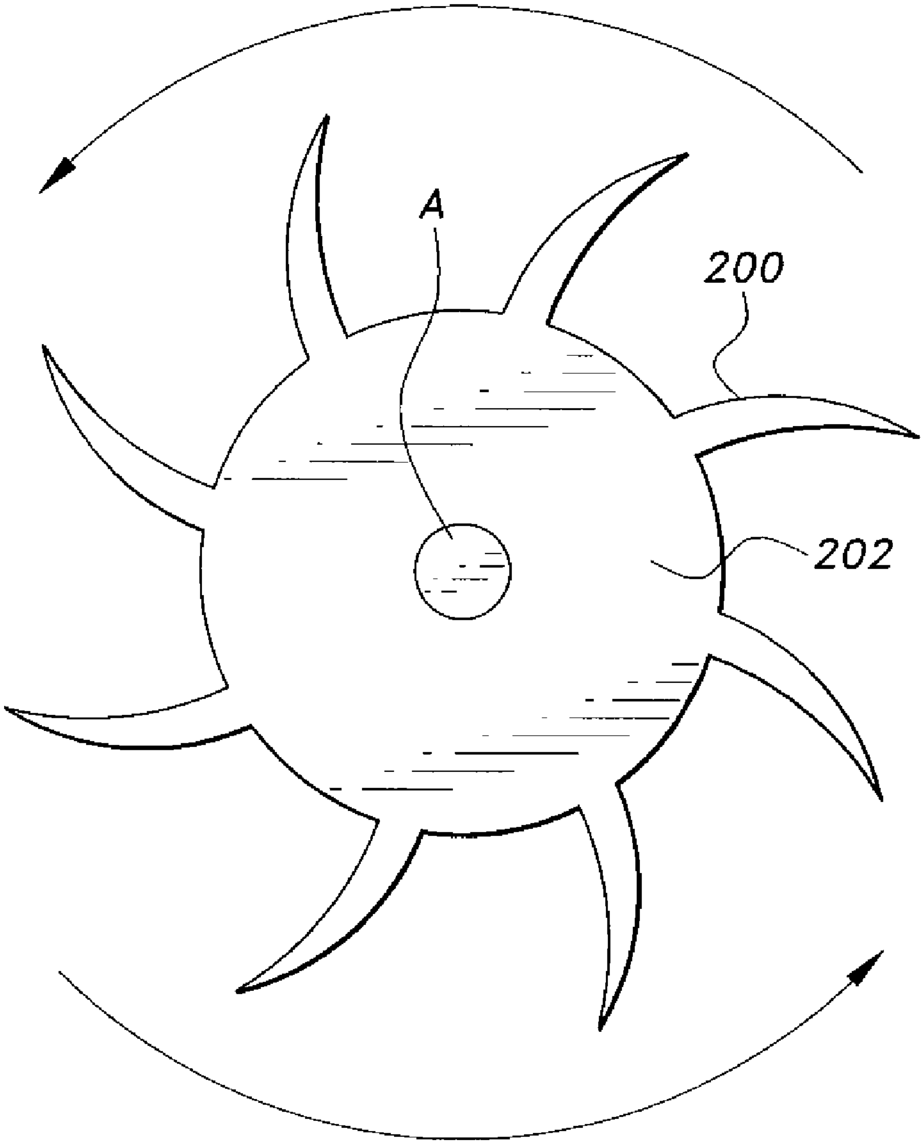
FIG. 2 is a bottom view of a turbine engine and axle assembly of the rotating coherent electromagnetic emission instrumentation apparatus according to the present invention.
Figure 3:
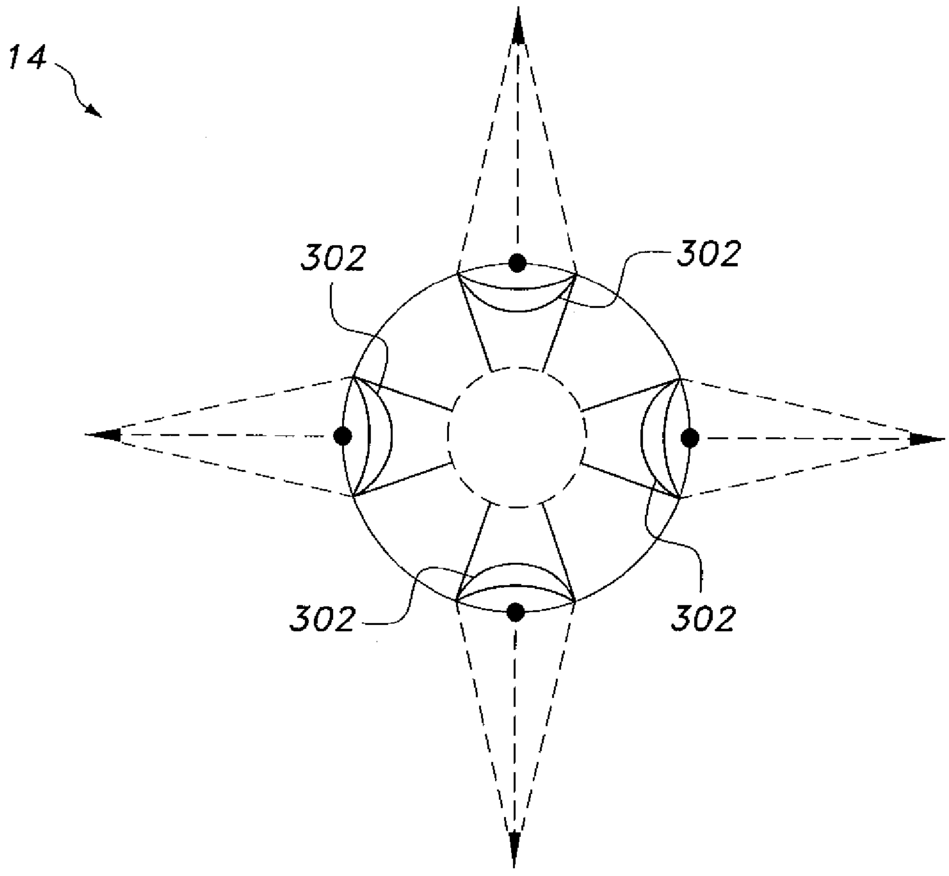
FIG. 3 is a diagrammatic view of a wave reflector assembly of the rotating coherent electromagnetic emission instrumentation apparatus according to the present invention.

As shown in FIGS. 1-3, the rotating coherent electromagnetic emission instrumentation apparatus 10 provides instrumentation for detecting and cataloguing energetic environmental anomalies that may occur along or proximate the circumferential path of a rotating electromagnetic (EM) wave beam B having sufficient revolutions per minute (RPM) that the instantaneous change in radial direction of the beam approaches 300,000,000 meters/second. Under those conditions, it is hypothesized that environmental anomalies, such as energy spikes, may occur along or proximate to the circumferential beam path. Sensors D are disposed along the circumferential path of the rotating beam. Sensor data providing energy readings are recorded in real time. The sensor data is analyzed in real time, and also post-processed. Since the wavefront energy is known along the circumference, any energy spikes recorded may be attributed to mass-like, submeasurable elements of space that may have come in contact with the mass-like components of the high speed rotating electromagnetic wave. It is expected that these energy spikes ultimately can be harnessed as an energy source. A facility may be provided to enclose the rotating apparatus 10 and sensors D, although operation of the apparatus 10 does not require a surrounding building.

As most clearly shown in FIGS. 1 and 2, the apparatus includes an exemplary turbine engine 202, which is an ultra-high RPM driver having arcuate vanes 200 for rotating a laser beam B at high rotational rate (ω), and sensors D for detecting environmental effects of the rotating beam B at a predetermined radial distance from the source of the rotating laser beam B. It should be clearly understood that an electric motor or other rotational kinetic energy driver with the correct RPM can work just as well to impart high rotational rate to laser beam B. The detection means includes a plurality of sensors D spaced at intervals along a circumference defined by the predetermined radial distance from the rotating beam source 11. Moreover, sensors D may be arranged inside a tube, the terminus of beam B defining the axial center of the tube. Preferably the sensors D are particle detectors. Particle/energy detectors are known to persons having ordinary skill in the art, and may include, but not be limited to, ionization counters, Geiger counters, Cerenkov counters, scintillating counters, and the like. It is expected that environmental perturbations in energy can be detected by arrays of the sensors D disposed at or proximate radial distance from the rotating laser 11.

Again, referring to FIGS. 1 and 2, the apparatus 10 is built on a lower level high speed support bearing 20*c* that allows the high speed rotary driving force of the turbine engine 202 to impart high speed rotary motion of the axle and all components above the motor 202 connected to the axle, the axle extending upward from the support bearing 20*c* and terminating in attachment to a mid-level support bearing 20*b*, which is slightly above the uppermost portion of the vanes 200 of the turbine engine 202.

An elongate emitter housing 12 is attached to and extends upward from the mid-level support bearing 20*b*. Preferably, the emitter housing 12 includes glass piping or other transparent material to allow EM waves to penetrate un-attenuated. The uppermost portion of the emitter housing 12 is rotationally attached to an upper level high-speed support bearing 20*a*, which stabilizes the positioning of the rotating emitter housing 12.

The entire rotating assembly, including the housing 12, is balanced about the axis of rotation of the axle to minimize unwanted inertial moments, i.e., wobble, during high speed rotation. A 45° electromagnetic wave reflector assembly 14 is disposed in the bottom portion of the emitter housing 12 at an axial center of the elongate emitter housing 12. A coherent electromagnetic emitter 11 is disposed inside the elongate emitter housing 12 along the axis of rotation of the rotating bearing platform 20*b*. The emitter 11 is affixed to the housing 12 with the aid of annular support mountings 16, the emitter 11 being disposed inside the annuli of support mountings 16 so that the coherent EM wave beam exiting the emitter 11 is aimed at the electromagnetic wave reflector assembly 14 to cause the wave beam to be reflected 90° by the reflector assembly 14, thus resulting in coherent a EM beam B, which extends outward in a radial direction from the axial center of the rotating bearing platform 20*b*. There can be more than one coherent electromagnetic emitter 11 so arranged inside the elongate emitter housing 12. The coherent electromagnetic emitter 11 may be a laser, a maser, or any other emitter that relies on stimulated electron quantum state transitions to produce a coherent beam. Preferably, the phase, frequency and wave structure of the emitter 11 is adjustable in real time. Moreover, the coherent electromagnetic emitter 11 may be configured to produce a phase singularity along the central axis of the beam resulting in a so called "long-focal length doughnut wave" structure. Such a reconfiguration of the electromagnetic wave generator 11 allows for the introduction of pre-measured seed and tracking particles along the radial line defined by the beam B to initiate and help manage operations of the apparatus 10. The emitter 11 may be powered by batteries, A.C. mains, or any other suitable power supply, and it is within contemplation of the present invention that available power sources may be scaled up according to the power requirements of the emitter 11.

The EM reflector assembly 14 may include a mounting base having a plurality of parabolic mirrors 302, as shown in FIG. 3, to provide an equal plurality of coherent beams B emanating in radial directions from the rotating platform 20*b*. Additionally, the parabolic mirrors 302 are designed to have an RPM-based focal length and wave realignment system wherein the focal length of the coherent beams B varies as a function of RPM. During rotational operation of the rotating coherent electromagnetic emission instrumentation apparatus 10, the coherent beam, e.g., a laser, preferably sweeps out a circumferential path around an axial center of the circumferential path to provide a tangential beam velocity of approximately 300,000,000 meters/second. This sweeping action imparts linear momentum to any "laser sensitive" materials that collide with the beam along the radial axis. Thus, the coherent beam "pushes" material out toward the periphery of light speed rotation.

As used herein, the following terms are defined as follows.

"Substance of Space (SoS)" means all of the mass and energy existing in the Universe that can be shown to exist by calculation, but heretofor has not been accounted for by scientific observation, scientific measurements, or "other' means. This is also referred to as "sub-measurable" elements of space.

"White Particles (WP)" are hypothesized to be a high energy mass-like substance that results from the collection and compression of the components of SoS when the speed of any substantive material (including such mass-like materials, such as photons) pass through SoS at a speed that is equal to, or closely approaches, the speed of light.

"Ultra-high speed rotation" is rotation that exceeds 50,000 revolutions per minute (RPM), with a preferred RPM of 300,000 RPM or higher.

"Speed of Light" in a vacuum is a physical constant having the value of approximately 300 million meters per second (186,000 miles per second).

"Laser Light" is a representative example of a highly coherent electromagnetic wave beam.

"Photon" is defined as an elemental particle that is the quantum of electromagnetic interaction and the basic unit of light and all other forms of electromagnetic radiation. It is also defined as the force carrier for electromagnetic force. Like all elementary particles, photons are governed by quantum mechanics and exhibit wave-particle duality. As such, photons (in motion) are further defined as the "mass-like" component of electromagnetic waves that demonstrate matter like characteristics.

Within this patent application is a description of the system design and methodology required for the generation of the hypothesized White Particles (WP), a process that is further hypothesized to release energy. Since this invention is pragmatic in nature, a full explanation of the mechanism of WP formation is not essential to the performance of this invention. Notwithstanding that condition, a brief summary of the inventor's vision of the most likely mechanisms of formation is presented below to assist in the communication of invention characteristics.

The dominant mechanical force associated with the hypothetical White Particle formation is conjectured to be similar to the compression of air at the leading edge of an aircraft as that aircraft approaches the sound barrier. Following that imagery, the air in this example may be equivalent to sub-measurable mass-like components, and may comprise Substance of Space (SoS) in the path of rotation. To carry that imagery further, the aircraft equivalent in WP generation is the mass-like electromagnetic wave property of individual photons that are being rotated at or near light speed.

"Mass-like attractive force" is defined herein as the sub-measurable elements of SoS that collectively exert a mass-like, gravitational-like force on the observable matter in the Universe. While there is still some disagreement in the physics community at large as to the exact nature of this collective force, the existence of that force has been confirmed by experimentation and Cosmological observation. Based on that work by "others", it has been concluded that this "Mass-like attractive force", as described above, extends to the individual sub-measurable elements of SoS when those elements of SoS are compressed sufficiently by mechanical forces to allow the Mass-like Attractive Force to take effect. For the purposes of visualization, this force can be viewed as a process that is similar to the formation of planets and rubble asteroids by gravitational attraction.

One generally accepted conclusion that extends from Einstein's Theory of Relativity is that mass compresses in the direction of flow as the speed of that mass approaches light speed. Accordingly, it is possible that this compressive force will also apply to the sub-measurable elements of SoS that are mechanically collected and compressed sufficiently to exhibit mass-like properties as they form at light speed. Consistent with the above, this invention generates White Particles for use as a source of energy as summarized below.

One or more electromagnetic (EM) wave generators (such as lasers or masers) are rotated at sufficient revolutions per minute (RPMs) to cause mass-like photons that are integral to the rotating EM waves to approach a tangential velocity of rotation approaching the speed of light at a calculated distance from the center of rotation. The specific distance from the center of rotation that is required for the EM waves to reach light speed depends upon the speed (RPMs) of rotation. A visual representation of this WP generation system is presented in FIG. 4, in which it is shown that a theoretical white particle WP may be liberated by a focused electromagnetic wave W generated by an electromagnetic wave generator g, where the wave W has a radius of rotation r and a tangential velocity v at a point a, the tangential velocity being imparted by a rotation driver m. The formula for determining the specific distance from the center of rotation required to reach light speed is calculated using the RPM of rotation and the circumference of a circle, and is defined as:

$$r=(V_{tan}*60)/2\pi*\text{RPM} \qquad (1)$$

which is derived from the relation:

$$\text{RPM}=V_{tan}*60/2\pi r; \qquad (2)$$

where $V_{tan}$ is the desired tangential velocity, i.e., light speed, which is 186,000/η miles/second, and r is in miles, or in Le Système International (SI), light speed being 300,000,000/η meters/second and r being in meters. In either case, η is the refractive index of light in the medium that beam B is propagating through.

Additionally, Table 500, shown in FIG. 5, illustrates the results of calculation for various RPMs, as well as examples of commercially proven rotary drivers where similar RPMs can be achieved to induce acceleration of Dark Matter to form the theorized White Particle. White Particles, generated as theorized to exist, possess both the energy of formation and the energy of mass in motion at light speed.

These combined WP energies are believed to exceed the energy input required for EM wave generation and rotation of the inventive rotating coherent electromagnetic emission instrumentation apparatus. Thus, energy recovery from White Particle generation may require adaptations of physical energy processing systems to accommodate this proposed energy source. Three examples of such adapted systems are: Friction Based Thermal Energy Generation, Continuous Impact Power Generation, and Continuous White Particle Colliders Systems with Associated Energy Recovery Units.

The inventive rotating coherent electromagnetic emission instrumentation apparatus 10 provides an instrumentation system that is capable of determining whether a hypothesized high-energy mass-like White Particles (WP) material exists. It is hypothesized that the White Particles (WPs) formed as described herein possess both energy of formation and energy of mass-in-motion at light speed. If the inventive apparatus determines that WPs exist, then a portion of the White Particles may be available for recovery and use as an energy source.

This inventive rotating coherent electromagnetic emission instrumentation system uses a pragmatic approach to investigate the possible formation of the hypothesized high energy mass-like WPs. As such, the inventive system does not require taking a position regarding the ongoing theoretical physics debates addressing the composition and structure of Dark Matter, Dark Energy, or Dark Fluid. For similar reasons, though a speculative description of the mechanisms associated with the compression of the substance of space (SoS) to form White Particles is provided, the occurrence of the below-described mechanisms is not essential to the functional embodiment of the rotating coherent electromagnetic emission instrumentation apparatus.

The hypothesized high energy mass-like WPs, are believed by this inventor to form through the collection and compression of SoS when electromagnetic waves are rotated at sufficient RPM to produce a tangential velocity that approaches light speed at a specified distance from the center of rotation. Furthermore, because these White Particles possibly form at light speed, they are believed to possess both energy of formation and an energy of mass-in-motion at light speed. The hypothesized energetic White Particles could be used as a non-fossil fuel and non-nuclear based energy source.

Because of the above, the only non-physical proof of functionality for processes, systems, and methodologies linked to Dark Matter and Dark Energy is through the construction of a logic thought model based on the indirect cause and effect observations done by others to date. The key elements of the proposed model to be investigated with the aid of the rotating coherent electromagnetic emission instrumentation apparatus 10 are SoS, the naming of which is being used to avoid conflict with existing terms like Dark Matter and Dark Energy, which may have meanings and connotations to others which extend beyond or directly conflict with the concept of SoS as it is used herein.

Based on research and internal logic arguments, at least a portion of the aforementioned SoS is purported to exhibit indirectly observable mass-like properties. One such property may be cumulative gravitational attraction with atom-based mass. Accordingly, SoS is consistent with the model of a heterogeneous gas-like fluid that is dispersed throughout the observable Universe in varying density concentrations.

In the theory of relativity, the speed of light connects space and time, and appears in the famous equation of mass-energy equivalence, $E=mc^2$. The speed of light is the speed of all mass-less particles and associated fields in vacuum, and it is predicted by the current theory to be the speed of gravity and of gravitational waves, and an upper bound on the speed at which energy, matter, and information can travel.

The speed at which light propagates through transparent materials, such as glass or air, is less than 300,000,000 m/s. The ratio between a and the speed v at which light travels in a material is called the refractive index $\eta$ of the material ($\eta=a/v$). For example, for visible light, the refractive index of glass is typically around 1.5, meaning that light in glass travels at $c/1.5\approx200{,}000$ km/s. The refractive index of air for visible light is about 1.0003, so the speed of light in air is very close to c. Combining the above information into the logic model used to build this invention is summarized below:

First, based on the above, the speed of light is not a true constant in the definitive sense of the word. It is, in fact, a variable, the value of which is determined by the "characteristics" of the media that the information, energy, or matter associated with the measurement passes through. That media "characteristic" is defined by the refractive index of the media. In other words, the refractive index for any media (including the vacuum of space) represents its resistance to the flow of information, energy, matter or mass-like substance through it. For the model defined herein, this resistance to flow (or propagation) is a physical resistance to flow that results from the resistance to dissipations of the "bleed-off" of SoS material in the path of flow. At typical daily living conditions, the rate of speed and movement through the environment is insignificant compared to the SoS bleed-off rate, and the resistance is not detectable. It is not until the rate of speed through a media approaches light speed that the effects of the definitive speed of SoS bleed-off is observable.

Second, using a common physical analogy for the extension of the logic of this model, the "natural" limit to bleed-off of SoS is set by the cosmological equivalent of the "viscosity" of SoS in the vicinity of the path of flow. Again, while there may be a very complex relationship between the attractive force associated with the sub-measurable elements of SoS; these can collectively be addressed by the fact that any system bleed-off rate cannot exceed the generally accepted limit of the speed of light in the media of operation. The net impact of this operational limitation is that any of the sub-measurable components of SoS that are in the path of flow of information, energy, or matter moving at or near light speed can not bleed-off the leading edge of flow faster that the speed of light. As a result, in the case where the flow through SoS is equal to (or approaches) the speed of light, the SoS material in the path of flow must collect at the leading edge of flow, and thus begin the process of White Particle formation.

Moreover, the proposed logic model describes a unidirectional flow at or near light speed through any media (like the propagation of an electromagnetic wave through the "vacuum" of space) would result in the generation of a mass-like substance at the leading edge that would have the characteristics of matter while in motion at light speed, but would not possess measurable mass characteristics while at rest.

Figure 4:
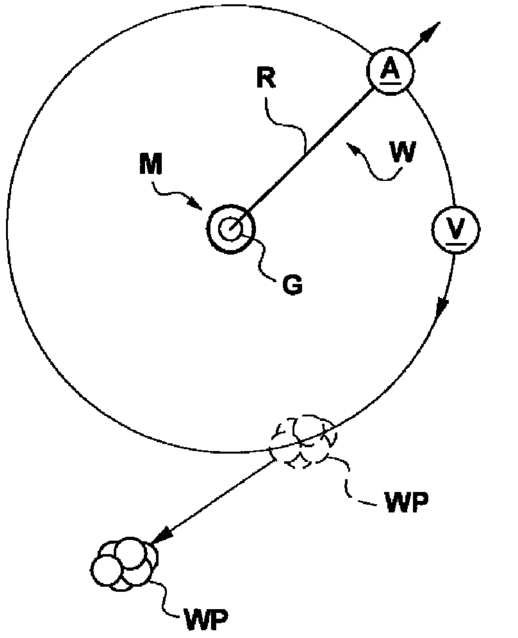
FIG. 4 is a diagram of a theoretical energetic particle generation system.

Extending the logic of the herein proposed model to encompass the addition of externally driven high speed rotation of an electromagnetic wave produced by the inventive rotating coherent electromagnetic emission instrumentation apparatus 10, the photons that are integral to that electromagnetic wave are subjected to an additional sustained tangential velocity equal to or closely approaching light speed at a predetermined distance from the center of rotation, as shown in FIG. 4.

Figure 6:
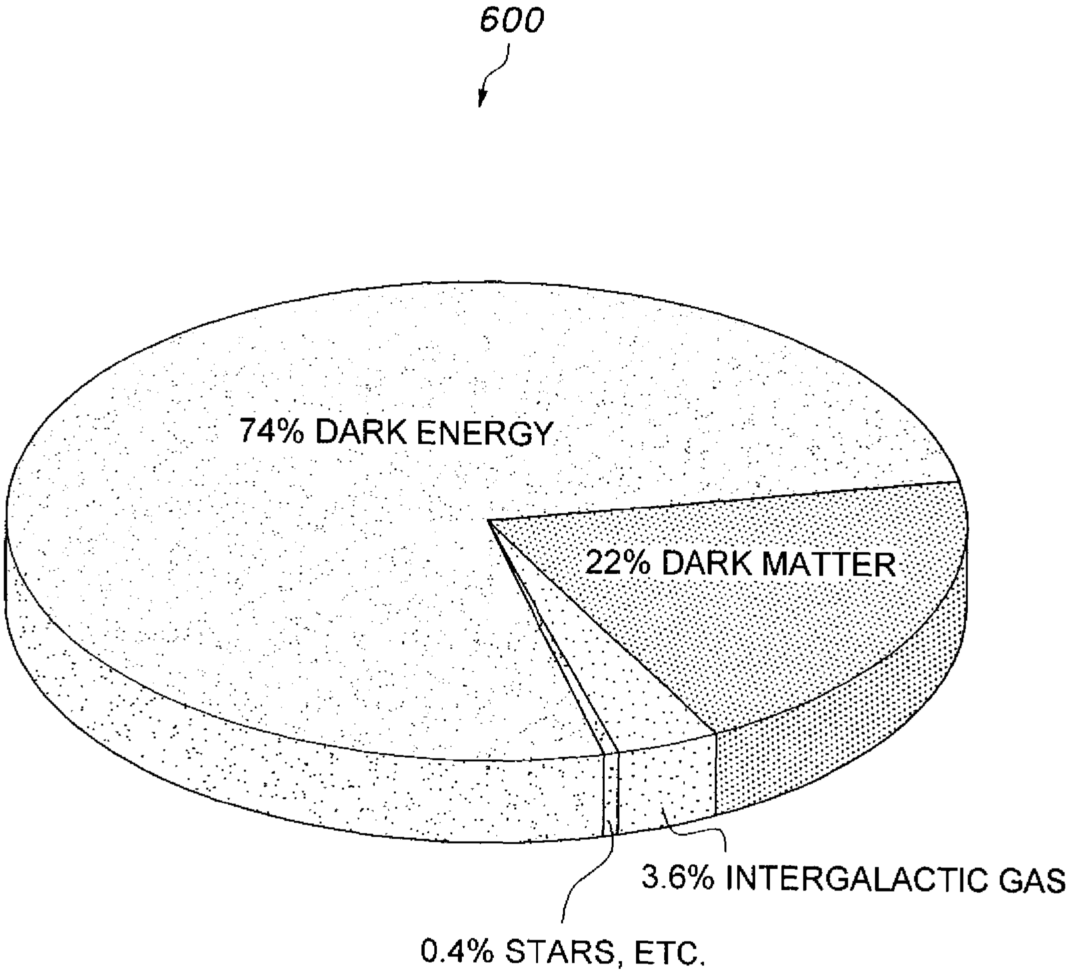
FIG. 6 is a pie chart showing an estimated distribution of cosmological dark matter, dark energy, and known matter-energy.

As shown in the pie chart 600 of FIG. 6, most (96%) of the Cosmos is estimated to be either dark energy or dark matter. It is theorized herein that this 96% of the Cosmos is substance of space (SoS). The noted external sustainable "pressure" that results from the inventive coherent EM wave rotation causes the sub-measurable elements of SoS to compress to a point where the individual "gravitational-like" attraction of the SoS elements take over and complete the White Particle formation process. This process is speculated to be similar in nature to that of the formation of rubble asteroids.

The resulting White Particles theorized to be generated using this methodology possess both energy of formation and the energy of mass-in-motion at light speed. These combined energies are theorized to exceed the total energy input required for electromagnetic wave generation and rotation because the theoretical White Particles are hypothesized to form at light speed using sub-measurable particle forces from SoS elemental materials for agglomeration and compression. The increase in total White Particle Generator energy, before and after White Particle formation, is theorized to be a source of new energy whose existence is to be investigated and/or confirmed by the inventive rotating coherent electromagnetic emission instrumentation apparatus.

The novelty, the performance, and the usefulness of the rotating coherent electromagnetic emission instrumentation apparatus are in no way jeopardized if the herein suggested novel theories happen to be imprecisely or even wrongly defined. In fact, the experiments with the inventive rotating coherent electromagnetic emission instrumentation apparatus will allow scientists to learn a great deal more about the effects on the surrounding environment of the electromagnetic wavefront formed by a very high angular rate (ω) rotating laser of the inventive rotating coherent electromagnetic emission instrumentation apparatus described herein.

It is to be understood that the present invention is not limited to the embodiment described above, but encompasses any and all embodiments within the scope of the following claims.

I claim:

1. A rotating coherent electromagnetic emission instrumentation apparatus, comprising:

a rotating platform having an axis of rotation;

an elongate emitter housing attached to and extending above the rotating platform, the elongate emitter housing having an electromagnetic (EM) wave transparent bottom portion, the housing being centered about the axis of rotation of the platform;

a 45° electromagnetic wave reflector disposed in the bottom portion of the elongate emitter housing at an axial center of the elongate emitter housing;

at least one coherent electromagnetic emitter disposed inside the elongate emitter housing along the axis of rotation of the rotating platform, the emitter being aimed at the electromagnetic wave reflector to cause an emitted EM beam to be reflected 90° by the reflector;

an ultra-high revolutions per minute (RPM) driver attached to the rotating platform, the ultra-high RPM driver supplying rotational kinetic energy to the rotating platform and emitter housing; and a plurality of sensors spaced at intervals along a circumference defined by a predetermined radial distance from an origin of the 90° reflected emitted EM beam, the sensors having means for recording energy spikes proximate the predetermined radial distance.

2. The rotating coherent electromagnetic emission instrumentation apparatus according to claim 1, wherein said coherent electromagnetic emitter is a maser.

3. The rotating coherent electromagnetic emission instrumentation apparatus according to claim 1, wherein said coherent electromagnetic emitter is a laser.

4. The rotating coherent electromagnetic emission instrumentation apparatus according to claim 1, wherein the housing has an upper end, the apparatus further comprising an upper level high speed support bearing supporting the housing at the upper end.

5. The rotating coherent electromagnetic emission instrumentation apparatus according to claim 1, wherein the housing has a lower end, the apparatus further comprising a mid-level support bearing supporting the housing at the lower end.

6. The rotating coherent electromagnetic emission instrumentation apparatus according to claim 1, wherein the housing has a lower end, the apparatus further comprising a lower level high speed support bearing supporting the Ultra high RPM driver at its lower end.

7. The rotating coherent electromagnetic emission instrumentation apparatus according to claim 1, wherein said 45° electromagnetic wave reflector further comprises:

a mounting base disposed in said housing; and a plurality of parabolic mirrors attached to said mounting base, the parabolic mirrors adjusting a focal length of the EM beam based upon a specific RPM of said rotating platform.

8. The rotating coherent electromagnetic emission instrumentation apparatus according to claim 1, wherein said ultra high RPM driver is a turbine engine.

9. The rotating coherent electromagnetic emission instrumentation apparatus according to claim 1, wherein the ultra-high revolutions per minute (RPM) provides a tangential beam velocity of approximately 300,000,000/η meters/second, the ultra high RPM being defined by the relation:

$$RPM=(300,000,000/\eta)(60)/2\pi r$$

where r is the radial distance in meters along the EM beam and 300,000,000/η is the desired tangential velocity of the EM beam in meters per second, η being the refractive index of light in the medium that said beam is propagating through.

10. The rotating coherent electromagnetic emission instrumentation apparatus according to claim 1, further comprising a plurality of annular support mountings attached to said emitter housing, the annular support mountings stabilizing positioning of said emitter in said emitter housing.

11. The rotating coherent electromagnetic emission instrumentation apparatus according to claim 1, wherein said at least one coherent electromagnetic emitter comprises a plurality of coherent electromagnetic emitters.

12. A rotating coherent electromagnetic emission instrumentation apparatus, comprising:

means for generating a coherent electromagnetic emission;

means for directing the coherent electromagnetic emission along a radial line extending from a source of the coherent electromagnetic emission;

means for rotating the radial line directed coherent electromagnetic emission at a predetermined rotation rate sweeping out a circumferential path of the coherent electromagnetic emission around an axial center of the circumferential path to provide a tangential beam velocity of the coherent electromagnetic emission of approximately 300,000,000/η meters/second, the rotation rate being defined by the relation:

$$RPM=(300,000,000/\eta)(60)/2\pi r$$

where r is the radial distance in meters along the EM beam and 300,000,000/η is the desired tangential velocity of the EM beam in meters per second, η being the refractive index of light in the medium that said beam is propagating through; and means for recording energy spikes proximate the radial distance from the source of the rotating coherent electromagnetic emission.

13. The rotating coherent electromagnetic emission instrumentation apparatus according to claim 12, wherein said means for generating a coherent electromagnetic emission further comprises means for generating a coherent microwave emission.

14. The rotating coherent electromagnetic emission instrumentation apparatus according to claim 12, wherein said means for generating a coherent electromagnetic emission further comprises means for generating a coherent emission of light.

15. A method of detecting a Substance of Space, comprising the steps of:

emitting a coherent beam of electromagnetic radiation;

sweeping the beam of electromagnetic radiation through an arc of 360° at a speed such that at any given radial distance along the beam, the beam has a tangential velocity approaching the speed of light;

placing a plurality of sensors in the path of the beam, the sensors being angularly spaced apart;

calculating energy of the beam from measurements made by the sensors; and attributing spikes in energy above the energy of the beam to a Substance of Space.

16. The method of detecting a Substance of Space according to claim 15, wherein the step of emitting a coherent beam of electromagnetic radiation comprises emitting a laser beam.

17. The method of detecting a Substance of Space according to claim 15, wherein the step of emitting a coherent beam of electromagnetic radiation comprises emitting a maser beam.

18. The method of detecting a Substance of Space according to claim 15, wherein the sensors comprise particle sensors.

19. The method of detecting a Substance of Space according to claim 15, wherein the sensors comprise energy sensors.

* * * * *